United States Patent
Huang

(10) Patent No.: US 10,198,197 B2
(45) Date of Patent: Feb. 5, 2019

(54) METHOD AND APPARATUS FOR FLEXIBLE RAID IN SSD

(71) Applicant: Futurewei Technologies, Inc., Plano, TX (US)

(72) Inventor: Yiren Huang, San Jose, CA (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/204,308

(22) Filed: Jul. 7, 2016

(65) Prior Publication Data

US 2016/0320991 A1 Nov. 3, 2016

Related U.S. Application Data

(63) Continuation of application No. 13/460,686, filed on Apr. 30, 2012, now Pat. No. 9,424,128.
(Continued)

(51) Int. Cl.
| | |
|---|---|
| *G06F 12/02* | (2006.01) |
| *G06F 3/06* | (2006.01) |
| *G06F 11/10* | (2006.01) |
| *G11C 29/00* | (2006.01) |
| *G11C 29/52* | (2006.01) |

(52) U.S. Cl.
CPC .......... *G06F 3/0619* (2013.01); *G06F 3/064* (2013.01); *G06F 3/0629* (2013.01); *G06F 3/0638* (2013.01); *G06F 3/0688* (2013.01); *G06F 3/0689* (2013.01); *G06F 11/106* (2013.01); *G06F 11/1068* (2013.01); *G06F 12/0246* (2013.01); *G11C 29/52* (2013.01);
(Continued)

(58) Field of Classification Search
None
See application file for complete search history.

(56) References Cited

U.S. PATENT DOCUMENTS

| 6,000,006 A | 12/1999 | Bruce et al. |
| 6,288,940 B1 | 9/2001 | Kawamura |
(Continued)

FOREIGN PATENT DOCUMENTS

| CN | 201237907 Y | 5/2009 |
| CN | 101903866 A | 12/2010 |
(Continued)

OTHER PUBLICATIONS

Im, et al., "Flash-Aware RAID Techniques for Dependable and High-Performance Flash Memory SSD," IEEE Transactions on Computers, vol. 60, No. 1, Jan. 2011, 14 pages.
(Continued)

*Primary Examiner* — Charles Rones
*Assistant Examiner* — Ryan Dare
(74) *Attorney, Agent, or Firm* — Slater Matsil, LLP

(57) ABSTRACT

A solid state drive (SSD) employing a redundant array of independent disks (RAID) scheme includes a flash memory chip, erasable blocks in the flash memory chip, and a flash controller. The erasable blocks are configured to store flash memory pages. The flash controller is operably coupled to the flash memory chip. The flash controller is also configured to organize certain of the flash memory pages into a RAID line group and to write RAID line group membership information to each of the flash memory pages in the RAID line group.

19 Claims, 4 Drawing Sheets

Related U.S. Application Data

(60) Provisional application No. 61/523,251, filed on Aug. 12, 2011.

(52) U.S. Cl.
CPC ............ *G11C 29/82* (2013.01); *G06F 11/108* (2013.01); *G06F 2212/7208* (2013.01); *Y02D 10/13* (2018.01)

(56) References Cited

U.S. PATENT DOCUMENTS

| | | | |
|---|---|---|---|
| 6,952,797 B1 | 10/2005 | Kahn et al. | |
| 2007/0294570 A1 | 12/2007 | Poliselli et al. | |
| 2008/0177956 A1* | 7/2008 | Peddle | G11C 29/88 711/156 |
| 2008/0288814 A1* | 11/2008 | Kitahara | G06F 11/073 714/5.1 |
| 2009/0150599 A1 | 6/2009 | Bennett | |
| 2010/0030947 A1 | 2/2010 | Moon et al. | |
| 2010/0030948 A1 | 2/2010 | Moon et al. | |
| 2010/0082879 A1 | 4/2010 | McKean et al. | |
| 2010/0199125 A1* | 8/2010 | Reche | G06F 11/108 714/6.22 |
| 2010/0306581 A1 | 12/2010 | Johnson | |
| 2011/0010488 A1 | 1/2011 | Aszmann et al. | |
| 2011/0047316 A1 | 2/2011 | Farhan et al. | |
| 2011/0110158 A1 | 5/2011 | Schuette | |
| 2011/0131472 A1 | 6/2011 | Antonakopoulos et al. | |
| 2011/0173484 A1 | 7/2011 | Schuette et al. | |
| 2011/0179219 A1 | 7/2011 | Ma et al. | |
| 2011/0271039 A1 | 11/2011 | Baek et al. | |
| 2012/0317333 A1 | 12/2012 | Yamamoto et al. | |

FOREIGN PATENT DOCUMENTS

| | | |
|---|---|---|
| WO | 2009067476 A2 | 5/2009 |
| WO | 2010144587 A2 | 12/2010 |

OTHER PUBLICATIONS

NVM Express, Revision 1.0c, Feb. 16, 2012, 126 pages.

Wikipedia, RAID, http://en.wikipedia.org/wiki/RAID, Aug. 12, 2011, 22 pages.

STMicroelectronics, "Bad Block Management in NAND Flash Memories," Application Note, No. AN 1819, May 2004, XP002535765, 7 pages.

* cited by examiner

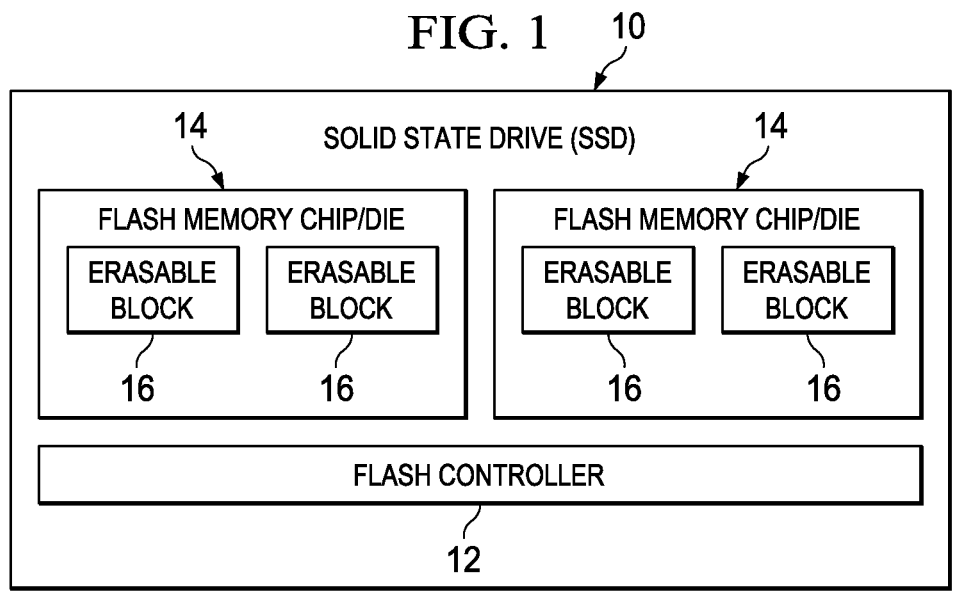
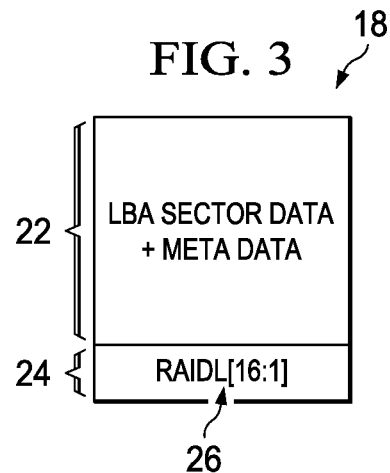

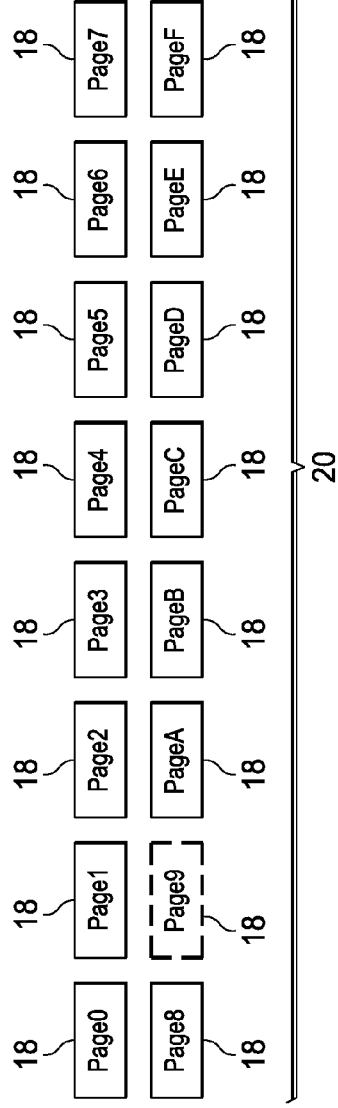
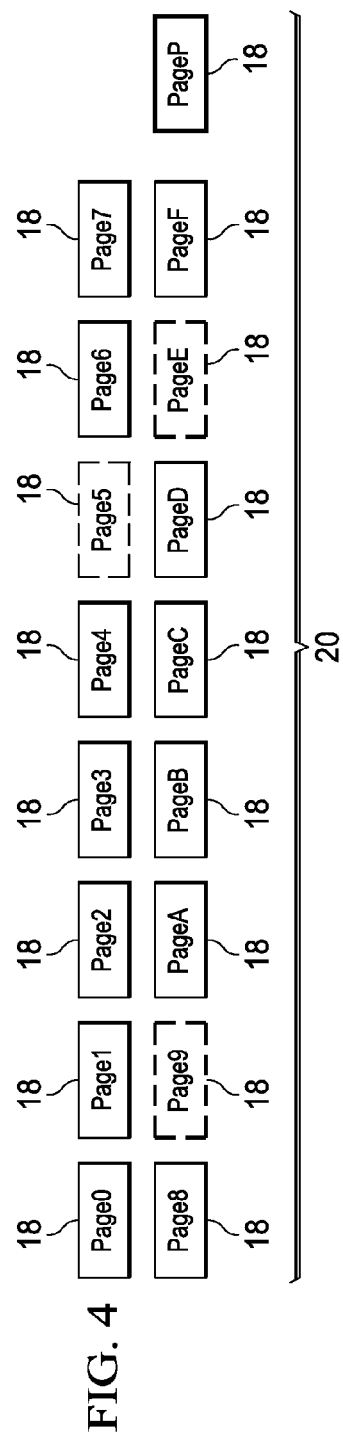
FIG. 2
FIG. 4
FIG. 5

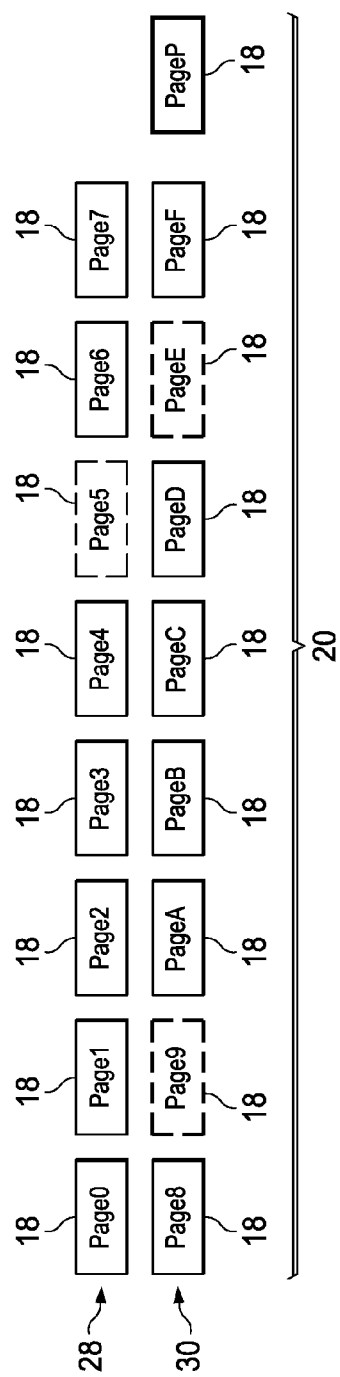

METHOD AND APPARATUS FOR FLEXIBLE RAID IN SSD

This patent application is a continuation of U.S. patent application Ser. No. 13/460,686, filed on Apr. 30, 2012, titled "Method and Apparatus for Flexible RAID in SSD," which claims priority to U.S. Provisional Application No. 61/523,251, filed on Aug. 12, 2011, titled "Method and Apparatus for Flexible RAID in SSD," both of which are hereby incorporated by reference herein as if reproduced in their entirety.

TECHNICAL FIELD

The present disclosure relates to memories, and, in particular embodiments, to a method and apparatus for flexible RAID in SSD.

BACKGROUND

Non-volatile memories have been used as memories in computers and portable information apparatuses. Recently, solid state drives (SSD) using NAND flash memory have gained in popularity for use in computers as an alternative to using simply a hard disk drive (HDD). SSD is considered to have great potential for making inroads in areas of use traditionally considered as limited to HDDs.

Solid State Drive (SSD) has lately been more and more adopted to be used in computer systems either as cache of Hard Disk Drive (HDD) or as a direct replacement of HDD. In such new architectures, the SSD are increasingly used to a) increase access speed to stored (or cached) data, b) reduce power consumption of HDD, c) reduce the size, weight, and power consumption profile of the system, and d) reduce the access latency to the stored (or cached) data.

NAND flash memory based SSD (solid state drive) has been widely adopted in various applications where data access speed is needed. The traditional RAID (redundant array of independent disks) scheme has been adopted in many SSD design. Such traditional RAID schemes, however, can only work if all elements in the RAID group are good.

SUMMARY OF THE DISCLOSURE

Technical advantages are generally achieved by embodiments of the present disclosure which provide a system and method for flexible RAID in SSD.

In an embodiment, a solid state drive (SSD) employing a redundant array of independent disks (RAID) scheme includes a flash memory chip, erasable blocks in the flash memory chip, and a flash controller. The erasable blocks are configured to store flash memory pages. The flash controller is operably coupled to the flash memory chip. The flash controller is also configured to organize certain of the flash memory pages into a RAID line group and to write RAID line group membership information to each of the flash memory pages in the RAID line group.

In an embodiment, a solid state drive (SSD) employing a redundant array of independent disks (RAID) scheme includes a flash memory chip, erasable blocks, and a flash controller. The erasable blocks are in the flash memory chip and configured to store one or more flash memory pages. The flash controller is operably coupled to the flash memory chip. The flash controller is configured to organize certain of the flash memory pages into a RAID line group, to exclude the flash memory pages that are bad from the RAID line group, and to write RAID line group membership information in the form of a binary/hexadecimal number to a RAID line (RAIDL) field within each of the flash memory pages in the RAID line group.

In an embodiment, a method of using a redundant array of independent disks (RAID) scheme for a solid state drive (SSD) includes organizing flash memory pages of an array of flash memory chips into a RAID line group and writing RAID line group membership information to each of the flash memory pages in the RAID line group. The RAID line group information identifies flash memory pages to be excluded during at least one of parity calculations and reconstruction of corrupt flash memory pages.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 1 provides an embodiment solid state drive (SSD);

FIG. 2 illustrates examples of flash memory pages organized in a redundant array of independent disks (RAID) line group and capable of being stored in erasable blocks of flash memory chips in the SSD of FIG. 1;

FIG. 3 provides an illustration of a data format for the flash memory pages of FIG. 2, the data field including a RAID line (RAIDL) field;

FIG. 4 provides an example of the RAID line group where one of the flash memory pages is corrupt and two of the flash memory pages are excluded from the RAID line group for reconstruction purposes;

FIG. 5 provides an example of the RAIDL field from the data format of FIG. 3;

FIG. 6 provides an example where the RAID line group of FIG. 2 has been divided into first and second RAID line groups;

FIG. 7 provides an example of first and second RAIDL fields corresponding to the first and second RAID line groups of FIG. 6;

DETAILED DESCRIPTION OF ILLUSTRATIVE EMBODIMENTS

Figure 8:
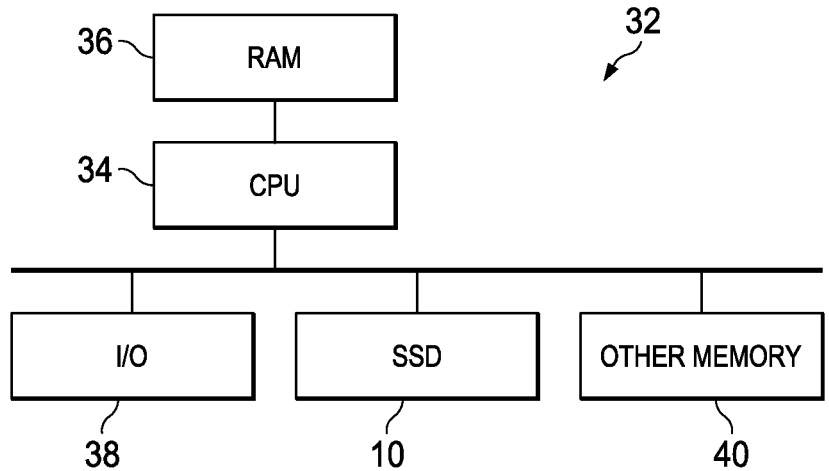
FIG. 8 provides a block diagram of an embodiment system using the SSD of FIG. 1 and that can implement embodiments of the present disclosure.

The making and using of the present embodiments are discussed in detail below. It should be appreciated, however, that the present disclosure provides many applicable inventive concepts that may be embodied in a wide variety of specific contexts. The specific embodiments discussed are merely illustrative and do not limit the scope of the disclosure.

Lately, the solid state drive (SSD), which may also be referred to as a solid-state disk or electronic disk, has been incorporated in computer systems either as the cache of a Hard Disk Drive (HDD) or as a direct replacement of the HDD. In such new architectures, the SSD is increasingly used to improve access speed to stored (or cached) data, to reduce power consumption of the HDD, to reduce the size, weight, and power consumption profile of the system, and to reduce the access latency to the stored (or cached) data.

However, the SSD, which is a NAND flash or other non-volatile memory type, has been error-prone. Therefore, a bit stored therein can easily become corrupted. Also, the error rate increases as the program erase cycles of the SSD increase. As such, even when advanced error correction coding (ECC) algorithms (e.g., the Bose Ray-Chaudhuri (BCH) ECC algorithm) have been used, there is still risk that a unit of data will not be correctable.

As will be more fully explained below, embodiments of this disclosure enable the SSD to flexibly organize flash memory pages, erasable blocks, and/or flash memory chips into a redundant array of independent disks (RAID) group. The RAID line group members may be chosen or selected based on, for example, the state of each silicon die, the write arrival pattern, or some other factor or factors that influence the membership of the RAID line group when data is actually written into the storage media. In other words, membership in the RAID line group is flexible. The members of the RAID line group may be identified by RAID group membership information, which may be written along with data to be stored. When a group member is read and determined to be corrupt by the ECC algorithm, the next neighbor where the RAID line group members reside may be read back and used to reconstruct the corrupt group member using, for example, an exclusive or (XOR) process Analysis shows that such a method may greatly enhance the reliability of the SSD and extend the drive life.

Referring now to FIG. 1, an embodiment SSD 10 utilizing a redundant data storage mechanism or scheme similar to hard drive based traditional RAID (redundant array of inexpensive (or independent) disks) is illustrated. As shown, the SSD 10 generally includes a flash controller 12 and flash memory chips 14, each of which may include several memory dies. The flash controller 12 (a.k.a., NAND flash controller or SSD controller) functions to, among other things, bridge the flash memory chips 14 to the computer hosting or using the SSD 10. In an embodiment, the flash controller 12 is an embedded processor that executes firmware level code. The flash controller 12 may, among other things, perform ECC, wear leveling, bad block mapping, read scrubbing and read disturb management, read and write caching, garbage collection, and encryption.

Still referring to FIG. 1, in an embodiment the flash memory chips 14 may be non-volatile NAND flash memory chips. Even so, other types of flash memory chips such as dynamic random-access memory (DRAM) may also be used. In addition, the flash memory chips 14 may be multi-level cell (MLC) flash memory or single-level cell (SLC) flash memory. While two of the flash memory chips 14 are illustrated in FIG. 1, more or fewer of the flash memory chips 14 may be included in the SSD 10.

In an embodiment, the flash memory chips 14 are divided into erasable blocks 16 (a.k.a., flash memory blocks or RAID blocks). A flash erase block is a minimum unit in NAND flash memory that may be erased at one time. While two of the erasable blocks 16 are illustrated in each of the flash memory chips 14 of FIG. 1, more or fewer of the erasable blocks 16 may be included in each of the flash memory chips 14. The erasable blocks 16 are generally configured to store flash memory pages 18 of data, which are illustrated in FIG. 2.

For the purpose of illustration, seventeen (17) of the flash memory pages 18 of data are depicted in FIG. 2. As shown, the flash memory pages 18 have been organized, written, or otherwise arranged by the flash controller 12 into a RAID line group 20. The seventeen flash memory pages 18 included in the RAID line group 20 have been designated Page0-Page9, PageA-PageF, and PageP. PageP represents a parity page. Each RAID line group 20 will have at least one parity page to provide redundancy to the RAID line group. Indeed, in case any member is corrupted, the parity page may be used to recover the failed member page using other member pages in the RAID line group and, for example, an XOR operation.

Because the RAID line group 20 includes seventeen flash memory pages that are written at one time and include one parity page, the RAID line group 20 may be referred to as a 16+1 RAID group. Notably, membership in the RAID line group 20 is flexible. In other words, the RAID line group 20 may include more or fewer flash memory pages 18 available within the erasable block 16 or on the flash memory chip 14.

Still referring to FIG. 2, some of the flash memory pages 18 from the RAID line group 20 are known to be bad (e.g., corrupt, contain an error, have a program failed status, read unsuccessfully due to bit errors or a page read time out, etc.). There may be several cases when a flash memory page 18 is determined to be bad. For example, the flash memory page 18 from the erasable block 16 (a.k.a., NAND flash memory block) may have gone bad due to a bus malfunction or a flash memory chip 14 malfunction.

In the embodiment of FIG. 2, Page9 has been detected as bad during a read process. Because Page9 has been detected as bad, Page9 will not participate in the parity calculation used to derive PageP. Page9 will also not be used to reconstruct corrupt flash memory pages 18 discovered or identified during a subsequent read operation. In other words, Page9 will remain in the physical RAID line group 20 but will be effectively excluded from the RAID line group 20 when the parity calculations are made and when recovering the data of later discovered failed flash memory pages. In an embodiment, the memory bus for Page9 is passed over or skipped to exclude Page9 as described herein.

In an embodiment, where one or more of the flash memory pages 18 encounters a program fail, such as Page9 in the above example, one option is to remove the failed flash memory page from the RAID line group 20 and then rewrite the RAID line group 20 to the next RAID line address if still using the same erasable block 16. Such an option presumes that the failed flash memory page 18 (e.g., Page9) is likely to fail again in the same erasable block 16. The treatment for parity page program failure will be the same as the regular page program failure. Although one RAID line may not be used to full potential in this scenario, because failure of flash memory pages 18 due to a program failure is infrequent, the impact on the SSD 10 will be very small. In this case, the write formatter may use the copy back command for all other pages except the parity page.

Referring now to FIG. 3, one of the flash memory pages 18 from FIG. 2 has been illustrated in further detail. As shown in FIG. 3, the flash memory page 18 has been divided into a logical block addressing (LBA) sector 22 and a RAID line (RAIDL) field 24. The LBA sector 22 stores the original data or the meta data corresponding to the original data. The meta data stored in the LBA sector 22 may be associated with the original data, used to protect the original data, or special to the original data (e.g., indicate the LBA address of the original data).

The RAIDL field 24 is employed to store the RAID line group membership information 26, which identifies the flash memory pages 18 in the physical RAID line group 20 that will be used in parity calculations and/or used in the reconstruction of flash memory pages that later become corrupt. The RAID line group membership information 26 stored in the RAIDL field 24 may also be used to identify which of the flash memory pages 18 will be excluded from the RAID line group 20 for the purpose of parity calculations and recovery or reconstruction of corrupt flash memory pages. In an embodiment, the RAID line group membership information 26 is stored in the RAIDL field 24 as a binary/hexadecimal number. In other embodiments, the RAID line group membership information 26 may be stored in other formats.

As example of how the RAID line group membership information 26 stored in the RAIDL field 24 may be used in an embodiment to identify the flash memory pages used in parity calculations and flash memory page reconstruction efforts is illustrated in FIGS. 4-5. As shown in FIG. 4, the flash controller 12 has organized or written certain flash memory pages 18 into a RAID line group 20. As shown, a total of seventeen flash memory pages 18 from the erasable block 16 on the flash memory chip 14 have been selected. Of the flash memory pages 18 in the RAID line group 20 of FIG. 4, two of the flash memory pages 18 are known to be bad, namely Page9 and PageE. Therefore, these pages will be excluded from parity calculations and flash memory page data reconstruction efforts.

In order to indicate that the flash memory pages Page9 and PageE are known to be bad, RAID line group membership information 26 is written by the flash controller 12 into the RAIDL field 24 as shown in FIG. 5. In the illustrative example of FIG. 5, because the flash memory pages Page9 and PageE are known to be bad, the hexadecimal number represented as 17'hlbdff is stored in the RAIDL field 24. As shown in FIG. 5, when the hexadecimal number is converted to binary, the bits associated with Page9 and with PageE are not set. Therefore, these bits are each a "0." In contrast, the bits associated with the flash memory pages 18 that will be used in parity calculations using the XOR process and flash memory page reconstruction are set. Therefore, these bits are each a "1."

Still referring to FIGS. 4-5, if during a subsequent read operation Page5 is discovered to be bad or corrupt due to, for example, bit errors, the flash memory pages 18 included in the RAID line group 20, with the exception of Page5, are read out. In other words, the flash memory pages 18 designated Page0, Page2, Page2, Page3, Page4, Page6, Page7, Page8, PageA, PageB, PageC, PageD, and PageF are read. Once read, these flash memory pages are used along with the parity page, PageP, in an XOR process to reconstruct the flash memory page Page5. Notably, the known bad flash memory pages 18 designated Page9 and PageE and the newly discovered bad flash memory page designated Page5 are not used to reconstruct the flash memory page designated Page5. In addition, if Page5 cannot, for some reason, be recovered or reconstructed using the above process due to, for example, an uncorrectable error, then the RAIDL field 24 may be updated such that the bit associated with Page5 is set to "0."

In an embodiment as shown in FIGS. 6-7, the RAID line group 20 may be divided into smaller RAID line groups, for example, a first smaller RAID line group 28 and a second smaller RAID line group 30. In other words, flexible RAID techniques may be used to break down the number of pages generally required by a fixed RAID group. In such embodiments, the RAIDL field 24 for the first smaller RAID line group 28 may be populated with the hexadecimal number is represented as 17h'000ff and the RAIDL field 24 for the second smaller RAID line group 30 may be populated with the hexadecimal number represented as 17'hlbd00. As shown in FIG. 7, the RAID line group membership information 26 stored in the RAIDL fields is complementary and collectively identifies the flash memory pages 18 included in the RAID line group 20. Indeed, the first eight flash memory pages 18 (Page0-Page7) are included in the first smaller RAID line group 28 (where Page5 may be discovered to be bad and later excluded) and the next eight flash memory pages 18 are included in the second smaller RAID line group 30 (where Page9 and PageE will be excluded from parity/reconstruction calculations). In this embodiment, one of the flash memory pages in the first smaller RAID line group 28 (e.g., Page7) may have to operate as a parity page similar to PageP.

Referring now to FIG. 8, the SSD may be incorporated into a computer system 32. The computer system 32 may be utilized to implement methods of the present disclosure. In this case, the main processing may be performed in a processor 34, which may be a microprocessor or any other appropriate processing device. Program code (e.g., the code implementing the algorithms or methods disclosed above) and data may be stored in a random access memory 36. The memory 36 may be local memory such as DRAM or mass storage such as a hard drive, optical drive, or other storage (which may be local or remote). While the memory 36 is illustrated functionally with a single block, it is understood that one or more hardware blocks may be used to implement this function.

In one embodiment, the processor 34 may be used to implement various ones (or all) of the functions discussed above. For example, the processor 34 may serve as a specific functional unit at different times to implement the subtasks involved in performing the techniques of the present disclosure. Alternatively, different hardware blocks (e.g., the same as or different than the processor 34) may be used to perform different functions. In other embodiments, some subtasks are performed by the processor 34 while others are performed using a separate circuitry.

FIG. 8 also illustrates an input/output (I/O) 38, which may be used to provide information to the system 32. This information could include, for example, video to be stored in the SSD 10. The I/O 38 may include ports for connection to a network, including the Internet or local interfaces (e.g., a USB or LAN interface). The I/O 38 can also include local user operated I/O device such as display, keyboard, mouse, and so on. In other words, the single box is provided to represent a potentially large number of hardware items.

The SSD 10 and other memory 40 (e.g., HDD, optical drive, or other) are shown connected to the same bus as the I/O 38. This is but one example of an architecture that may be suitably used. For purposes of simplicity, control circuitry, such as a memory controller or bridge, has been omitted from the drawing even though a practical system will include additional circuitry as appropriate.

Figure 9:
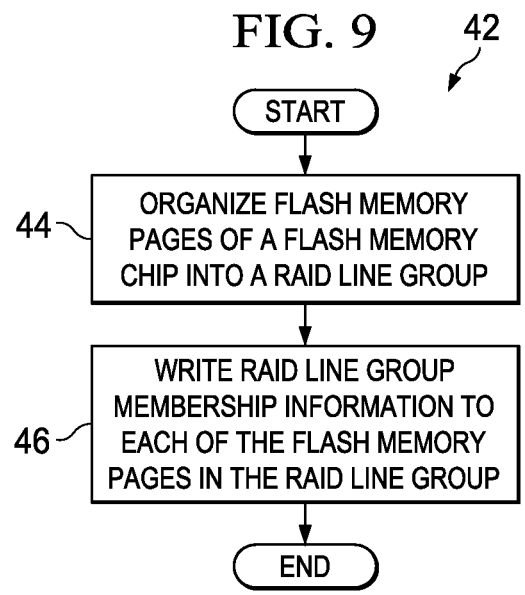
FIG. 9 provides an embodiment of a method of using a RAID scheme for the SSD of FIG. 1.

Referring now to FIG. 9, an embodiment of a method 42 of is illustrated. In block 44, selected ones of the flash memory pages 18 of the flash memory chip 14 are organized into the RAID line group 20. In block 46, the RAID line group membership information 26 is written to each of the flash memory pages 18 in the RAID line group 20. As noted above, the RAID line group member information 26 identifies the flash memory pages 18 to be excluded during parity calculations and/or reconstruction of corrupt flash memory pages 18. In an embodiment, the flash controller 12 or the processor 34 performs or coordinates these steps.

Using the flexible RAID scheme, algorithm, or processes disclosed herein, single or multiple flash memory page 18 failures may be tolerated and permit the SSD 10 to continue working properly. In addition, where the flexible RAID techniques are applied to the erasable blocks 16 or the flash memory chips 14 in the SSD 10, failures may also be tolerated and permit the SSD 10 to continue working properly.

Embodiments of the present disclosure provide a number of new and advantageous features. For example, one feature of this scheme is to use a RAID membership to indicate the member of a RAID line group and therefore allow flexible grouping of a RAID line. Such scheme allows tolerance of one or multiple members of a RAID group to malfunction without having to abandon the remaining good storage media. This scheme may be applied to the latest NAND flash based SSDs. Such scheme may also be applied to other storage media such as, for example, hard disk drive based RAID systems.

Embodiments of the present disclosure may be used in a number of products, processes, and services. For example, embodiments could be used in next generation Peripheral Component Interconnect Express (PCIE) SSD to improve the utilization of the SSD and life span of the SSD as a result. The flexible membership is superior to existing fixed RAID algorithms. This flexible RAID technique is advantageous in a number of markets including, but not limited to, enterprise storage systems.

As discussed above, embodiments have a number of benefits. By storing the data using RAID mechanism in SSD, a single page data loss may be recovered. Embodiments of the flexible RAID algorithm as described herein provide a way to flexibly decide the number of members in a RAID group. This enables the SSD to tolerate one or more members in RAID to fail and still able to recover data.

Benefits are achieved by having a flexible membership of the RAID algorithm to allow the design to tolerate single or multiple pages, blocks, or silicon dies to fail in SSD and still able to recover data lost.

In a disk drive based storage system, the RAID mechanism may be implemented to prevent one single disk to fail such as RAID 4 or RAID 5 mechanism by using one parity entry in a RAID group. In one embodiment, this disclosure calculates and stores the RAID membership along with data such that in case one device in RAID group fails, it may be skipped from the RAID membership when data is stored to the solid state drive. This way, when one member failed over time, the RAID membership may be read from the other pages in the RAID group and only these members in the RAID group will be used to determine the recovery by RAID algorithm.

While the disclosure has been made with reference to illustrative embodiments, this description is not intended to be construed in a limiting sense. Various modifications and combinations of the illustrative embodiments, as well as other embodiments, will be apparent to persons skilled in the art upon reference to the description. It is therefore intended that the appended claims encompass any such modifications or embodiments.

What is claimed is:

1. A device comprising:
an interface configured to be coupled to a data store comprising a plurality of storage pages; and
a storage controller coupled to the interface, the storage controller configured to:
organize a subset of the plurality of storage pages into a RAID group, each storage page of the RAID group including membership information identifying the subset of the plurality of storage pages in the RAID group; and
remove a bad storage page from the RAID group by modifying the membership information in each storage page of the RAID group to indicate removal of the bad storage page from the RAID group.

2. The device of claim 1, further comprising the data store.

3. The device of claim 2, wherein the data store is a flash memory chip.

4. The device of claim 2, wherein the data store is a hard disk drive.

5. The device of claim 1, wherein the data store comprises an erasable block, the erasable block including the plurality of storage pages, the erasable block being a minimum erasable unit for the data store.

6. The device of claim 5, wherein the membership information is a plurality of bits, each bit of the plurality of bits corresponding to a respective storage page of the erasable block, each bit indicating whether the respective storage page is in the RAID group.

7. The device of claim 1, wherein each of the plurality of storage pages comprises a logical block addressing (LBA) sector and a RAID line (RAIDL) field, the LBA sector storing data and metadata, the RAIDL field including the membership information.

8. The device of claim 1, wherein the storage controller is further configured to store the membership information on each of the storage pages in the RAID group.

9. The device of claim 1, wherein the storage controller is further configured to perform parity calculations with the storage pages of the RAID group.

10. The device of claim 1, wherein the storage controller is further configured to perform page reconstruction with the storage pages of the RAID group.

11. A system comprising:
one or more flash memory dies, each of the flash memory dies comprising a plurality of storage pages; and
a storage controller coupled to the flash memory dies, the storage controller configured to organize a first subset of the plurality of storage pages into a RAID line group, to store a group membership information for the RAID line group on each of the storage pages in the RAID line group, and to perform an error correction operation for the RAID line group with the storage pages in the RAID line group and the group membership information,
wherein the group membership information identifies respective ones of the storage pages excluded from the error correction operation,
wherein the group membership information stored on each of the storage pages in the RAID line group is a hexadecimal number, each bit of the hexadecimal number indicating a respective one of the storage pages in the RAID line group, each bit indicating whether the respective one of the storage pages is used for the error correction operation for the RAID line group.

12. The system of claim 11, wherein the error correction operation is one of parity calculations or reconstruction of corrupt storage pages.

13. The system of claim 11, wherein each of the storage pages comprises a logical block addressing (LBA) sector and a RAID line (RAIDL) field, the LBA sector storing data and metadata, the RAIDL field including the group membership information.

14. The system of claim 11, wherein the storage controller is further configured to detect a bad storage page of the storage pages in the RAID line group, and to remove the bad storage page from the RAID line group.

15. The system of claim 14, wherein the storage controller is further configured to modify the group membership information on each of the storage pages in the RAID line group to indicate the bad storage page.

16. The system of claim 14, wherein the storage controller is further configured to rewrite the RAID line group from the first subset of the plurality of storage pages to a second subset of the plurality of storage pages, the second subset of the plurality of storage pages having storage addresses adjacent to the first subset of the plurality of storage pages.

17. A method comprising:
- organizing a plurality of flash memory pages of a flash memory chip into a RAID line group; and
- writing RAID line group membership information to each of the flash memory pages in the RAID line group, the RAID line group membership information indicating, to each of the flash memory pages in the RAID line group, a subset of the plurality of flash memory pages to be included in an error correction operation, the RAID line group membership information being a binary number identifying the subset of the plurality of flash memory pages.

18. The method of claim 17, further comprising performing the error correction operation using only the subset of the plurality of flash memory pages identified by the binary number.

19. The method of claim 18, where the error correction operation is at least one of parity calculations and reconstruction of corrupt flash memory pages.

* * * * *